(12) United States Patent
Oh et al.

(10) Patent No.: US 12,406,841 B2
(45) Date of Patent: Sep. 2, 2025

(54) SEMICONDUCTOR FABRICATION APPARATUS AND FABRICATION METHOD

(71) Applicant: Samsung Electronics Co., Ltd, Suwon-si (KR)

(72) Inventors: Myoung-Kyu Oh, Gwangju (KR); Gyehoon Kwak, Anyang-si (KR); Junguk Kim, Hwaseong-si (KR); Hyeonju Kim, Gwangju (KR)

(73) Assignees: Samsung Electronics Co., Ltd., Suwon-si (KR); Gwangju Institute of Science and Technology, Gwangju (KR)

( * ) Notice: Subject to any disclaimer, the term of this patent is extended or adjusted under 35 U.S.C. 154(b) by 664 days.

(21) Appl. No.: 17/659,320

(22) Filed: Apr. 14, 2022

(65) Prior Publication Data

US 2023/0045027 A1 Feb. 9, 2023

(30) Foreign Application Priority Data

Aug. 9, 2021 (KR) .................. 10-2021-0104594

(51) Int. Cl.
| | |
|---|---|
| *C23C 16/44* | (2006.01) |
| *C23C 16/40* | (2006.01) |
| *C23C 16/458* | (2006.01) |
| *C23C 16/507* | (2006.01) |
| *H01L 21/02* | (2006.01) |

(52) U.S. Cl.
CPC ........ *H01L 21/02107* (2013.01); *C23C 16/40* (2013.01); *C23C 16/4582* (2013.01); *C23C 16/507* (2013.01)

(58) Field of Classification Search
CPC .......... H01J 37/32972; H01J 37/32981; H01J 37/32963; H01J 37/32917; G01J 3/443; C23C 16/4402; C23C 16/452
See application file for complete search history.

(56) References Cited

U.S. PATENT DOCUMENTS

| | | | | |
|---|---|---|---|---|
| 2,700,648 | A | * | 1/1955 | Thorp et al. ............ C01B 13/11 204/176 |
| 4,801,209 | A | * | 1/1989 | Wadlow et al. ....... G01N 21/68 356/417 |
| 5,546,322 | A | | 8/1996 | Gifford et al. |

(Continued)

FOREIGN PATENT DOCUMENTS

| | | |
|---|---|---|
| CN | 1304678 | 3/2007 |
| CN | 103760147 | 4/2014 |

(Continued)

OTHER PUBLICATIONS

Stellarnet, Inc.—New Product Release Jan. 15, 2016 (Year: 2016).*

(Continued)

*Primary Examiner* — Christopher A Johnson
(74) *Attorney, Agent, or Firm* — Morgan, Lewis & Bockius LLP

(57) ABSTRACT

A semiconductor fabrication apparatus comprises a process chamber, an ozone supply that provides the process chamber with ozone, an oxygen supply that provides the ozone supply with a source gas of the ozone, and a plurality of impurity detectors disposed between the oxygen supply and the ozone supply. The impurity detectors detect an inactive gas in the source gas.

9 Claims, 5 Drawing Sheets

(56) References Cited

U.S. PATENT DOCUMENTS

| | | | |
|---|---|---|---|
| 5,909,277 A | 6/1999 | Woskov et al. | |
| 5,991,020 A | 11/1999 | Loge | |
| 6,156,122 A * | 12/2000 | Lee | C23C 16/401 |
| | | | 257/E21.279 |
| 6,577,390 B1 | 6/2003 | Efthimion | |
| 6,643,014 B2 | 11/2003 | Chevalier et al. | |
| 6,717,666 B2 | 4/2004 | Satou et al. | |
| 7,123,361 B1 | 10/2006 | Doughty | |
| 7,403,283 B2 | 7/2008 | Sogan et al. | |
| 7,417,730 B2 | 8/2008 | Duan et al. | |
| 7,460,225 B2 | 12/2008 | Karanassios | |
| 8,188,444 B2 | 5/2012 | Zimmer | |
| 8,239,171 B2 | 8/2012 | Gamache et al. | |
| 8,462,335 B2 | 6/2013 | Bounouar et al. | |
| 11,390,635 B2 | 7/2022 | Kim et al. | |
| 2005/0274694 A1 * | 12/2005 | Funabashi | C23C 16/4402 |
| | | | 216/75 |
| 2007/0107751 A1 * | 5/2007 | Tokuno et al. | B08B 7/04 |
| | | | 134/10 |
| 2009/0031785 A1 | 2/2009 | Kellner et al. | |
| 2014/0227458 A1 * | 8/2014 | Karakawa et al. | G01J 3/443 |
| | | | 427/569 |
| 2015/0147488 A1 | 5/2015 | Choi et al. | |
| 2018/0292266 A1 * | 10/2018 | Slater et al. | G01J 5/061 |
| 2020/0135350 A1 | 4/2020 | Farouk et al. | |
| 2021/0166805 A1 | 6/2021 | Knoplioch | |

FOREIGN PATENT DOCUMENTS

| | | | | |
|---|---|---|---|---|
| CN | 103760147 A * | 4/2014 | | G01N 21/67 |
| CN | 203658267 | 6/2014 | | |
| CN | 106990099 | 7/2017 | | |
| CN | 110320203 | 10/2019 | | |
| CN | 111982884 A * | 11/2020 | | G01N 21/65 |
| CN | 112243494 | 1/2021 | | |
| JP | 2004053294 | 2/2004 | | |
| JP | 2007100620 | 4/2007 | | |
| JP | 2007163383 | 6/2007 | | |
| JP | 4692396 | 6/2011 | | |
| JP | 5483408 | 5/2014 | | |
| KR | 100565171 | 4/2006 | | |
| KR | 100822099 | 4/2008 | | |
| KR | 100891376 | 4/2009 | | |
| KR | 101367819 | 2/2014 | | |
| KR | 101441167 | 9/2014 | | |
| KR | 10-2015-0061179 | 6/2015 | | |
| KR | 10-1862309 | 5/2018 | | |
| KR | 101871809 | 8/2018 | | |
| KR | 10-2019-0059250 A | 5/2019 | | |
| KR | 102140711 | 8/2020 | | |
| KR | 10-2021-0033814 A | 3/2021 | | |

OTHER PUBLICATIONS

Fanying Meng et al., Chip-based ingroove microplasma with orthogonal signal collection: new approach for carbon-containing species detection through open air reaction for performance enhancement, Scientific Reports, vol. 4, pp. 4803 (2014).

B. Mitra, et al., Hybrid Arc/Glow microdischarges at atmospheric pressure and their use in portable systems for liquid and gas sensing, IEEE Transactions on Plasma Science 36 (4), pp. 1913-1924 (2008).

Lyndem B. Johnson Space Center, Houston, Texas, Spectroscopic determination of trace contaminants in high-purity oxyen, NASA Tech Briefs, Aug. 2013, pp. 18-19 (2013).

K.H. Schoenbach, et al., 20 years of microplasma research: a status report, The European Physical Journal D 70, article No. 29 (2016).

S.N. Atulov, et al., Universal sensor based on the spectroscopy ischarge for the detect on of or molecules in air, Rev. Sci. Instr. 89, Mar. 31, 2005 (2018).

* cited by examiner

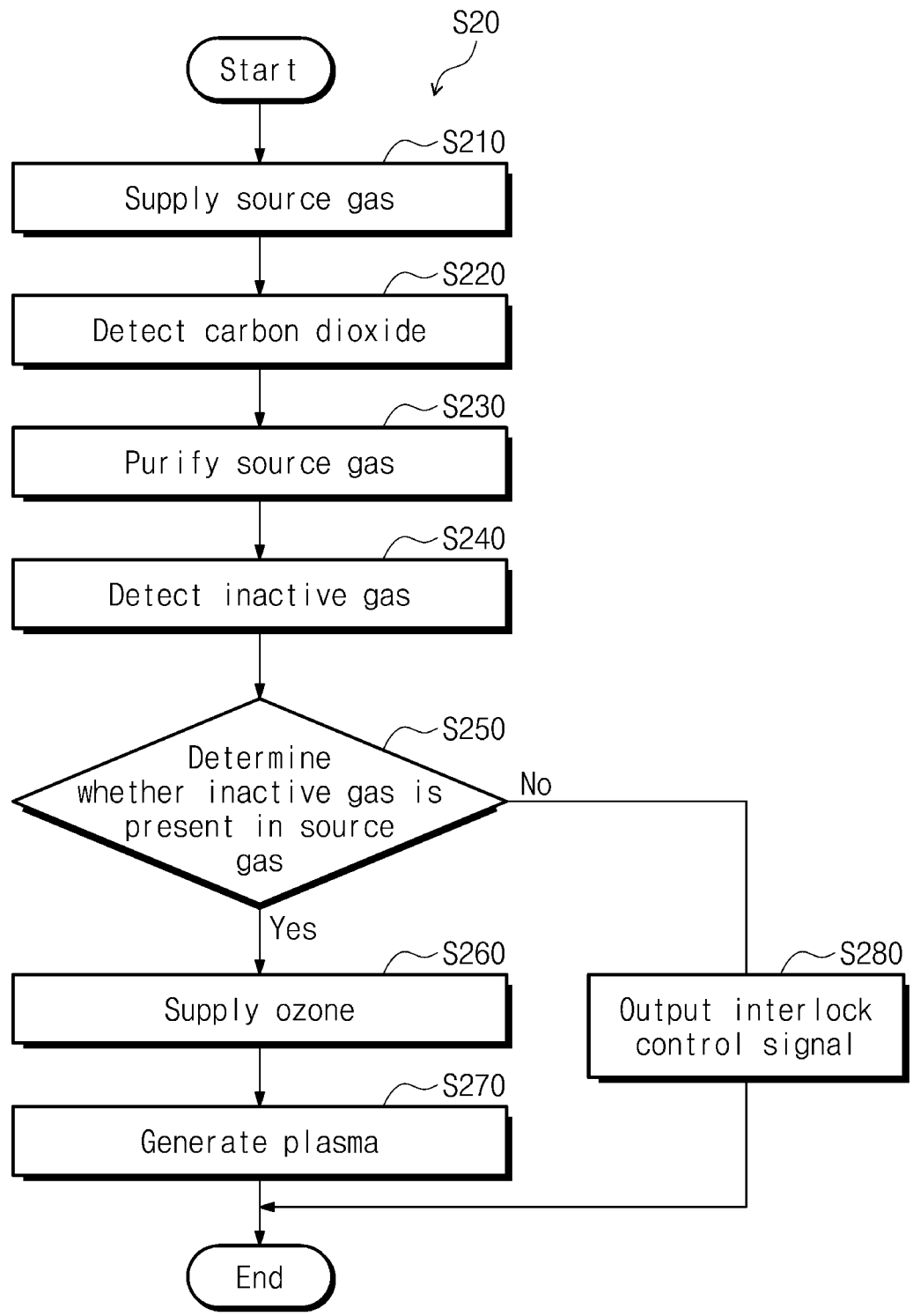

SEMICONDUCTOR FABRICATION APPARATUS AND FABRICATION METHOD

CROSS-REFERENCE TO RELATED APPLICATION

This U.S. nonprovisional application claims priority under 35 U.S.C § 119 from Korean Patent Application No. 10-2021-0104594, filed on Aug. 9, 2021 in the Korean Intellectual Property Office, the contents of which are herein incorporated by reference in their entirety.

TECHNICAL FIELD

Embodiments of the present inventive, concepts are directed to semiconductor fabrication apparatuses and fabrication methods, and more particularly, to semiconductor fabrication apparatuses and fabrication methods in which a thin film is formed on substrate.

DISCUSSION OF THE RELATED ART

In general, the fabrication of a semiconductor device requires a plurality of processes such as deposition, photolithography, and cleaning. Among these processes, deposition processes, such as chemical vapor deposition (CVD) or atomic layer deposition (ALD), are used to form a material layer on a substrate.

SUMMARY

Some embodiments of the present inventive concepts provide semiconductor fabrication apparatuses that increase a production yield of thin films.

According to some embodiments of the present inventive concepts, a semiconductor fabrication apparatus includes: a process chamber; an ozone supply that provides the process chamber with ozone; an oxygen supply that provides the ozone supply with a source gas for the ozone; and a plurality of impurity detectors disposed between the oxygen supply and the ozone supply. The impurity detectors detect an inactive gas in the source gas.

According to some embodiments of the present inventive concepts, a semiconductor fabrication apparatus includes: an ozone supply that provides ozone; an oxygen supply that provides the ozone supply with a source gas for the ozone; an oxygen purifier disposed between the oxygen supply and the ozone supply, where the oxygen purifier purifies the source gas; a first impurity detector disposed between the oxygen purifier and the oxygen supply, where the first impurity detector detect carbon dioxide in the source gas; and a second impurity detector disposed between the oxygen purifier and the ozone supply, where the second impurity detector detects an inactive gas in the source gas.

According to some embodiments of the present inventive concepts, a method of fabricating a semiconductor includes: loading a substrate onto a chuck; and forming a thin film on the substrate. The step of forming the thin film includes: supplying, a source gas; purifying the source gas by removing carbon dioxide from the source gas; and detecting an inactive gas in the source gas.

BRIEF DESCRIPTION OF THE DRAWINGS

FIG. 7 is a flow chart of a thin-film formation step shown in FIG. 6.

DETAILED DESCRIPTION

Figure 1:
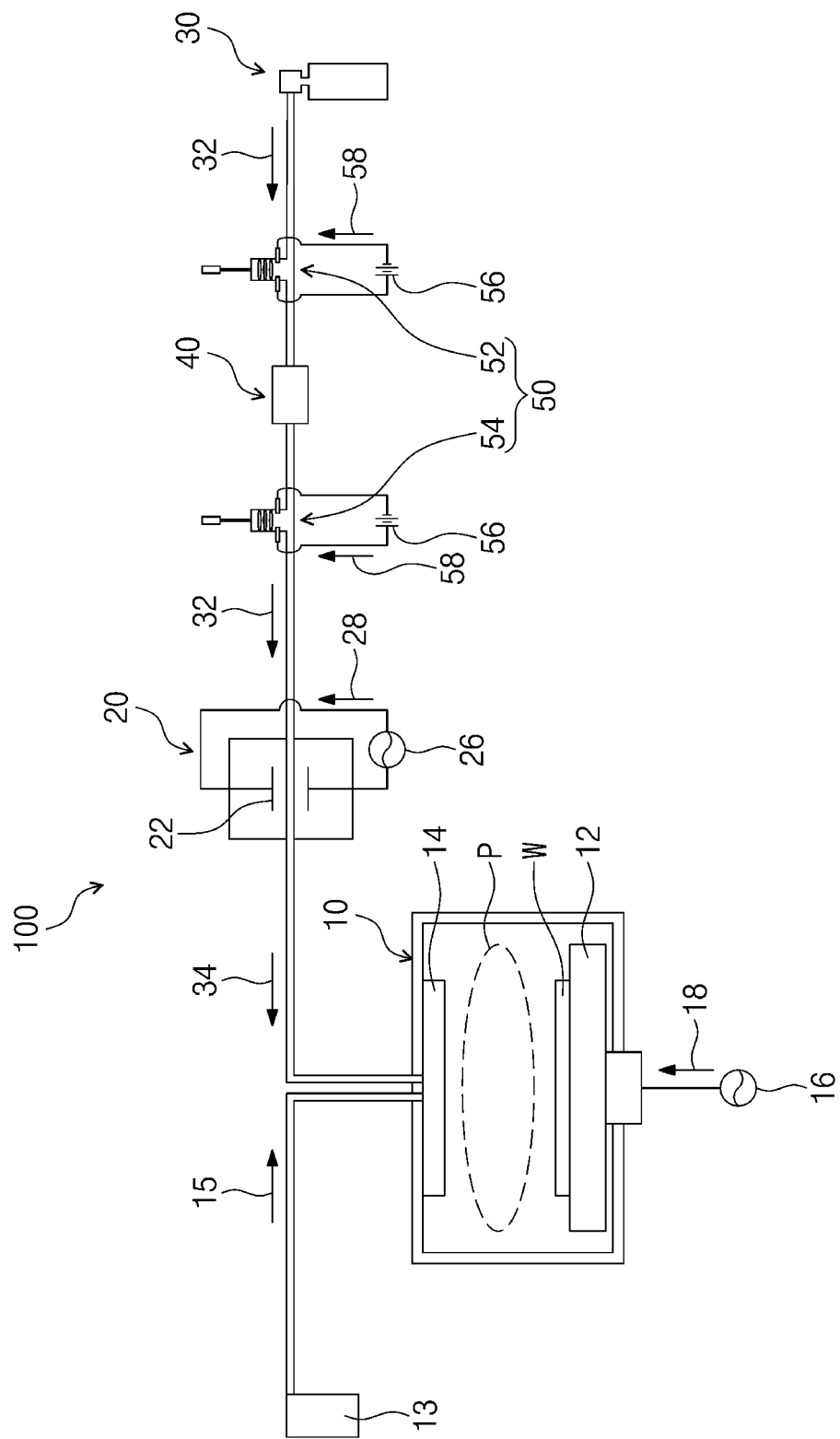
FIG. 1 is a schematic diagram of a semiconductor fabrication apparatus according to some embodiments of the present inventive concepts.

FIG. 1 shows a semiconductor fabrication apparatus 100 according to embodiments of the present inventive concepts.

Referring to FIG. 1, the semiconductor fabrication apparatus 100 according to an embodiment of the present inventive concepts includes a chemical vapor deposition apparatus. Alternatively, the semiconductor fabrication apparatus 100 according to an embodiment of the present inventive concepts includes a physical vapor deposition apparatus, but embodiments of the present inventive concepts are not limited thereto. In an embodiment, the semiconductor fabrication apparatus 100 includes a process chamber 10, an ozone supply 20, an oxygen supply 30, an oxygen purifier 40, and impurity detectors 50.

The process chamber 10 provides a substrate W with a hermetically sealed space to perform a fabrication process on the substrate W. The fabrication process may include a thin-film deposition process. For example, the fabrication process may be chemical vapor deposition (CVD) or physical vapor deposition (PVD), but embodiments of the present inventive concepts are not limited thereto. The process chamber 10 includes, for example, a chuck 12 and a showerhead 14.

The chuck 12 is disposed in a lower portion of the process chamber 10. The chuck 12 can load the substrate W. The chuck 12 uses a first radio frequency (RF) power 18 provided by a first power supply 16 to induce a plasma P on the substrate W. The chuck 12 may be one of an electrostatic chuck, a heater plate, or a susceptor, but embodiments of the present inventive concepts are not limited thereto.

The showerhead 14 is disposed in an upper portion of the process chamber 10, above the chuck 12. The showerhead 14 is connected to a precursor supply 13 and the ozone supply 20. The showerhead 14 provides the substrate W with a precursor gas 15 received from precursor supply 13 and ozone 34 received from the ozone supply 20 and forms a thin film on the substrate W. For example, thin film includes a metal oxide such as zirconium oxide ($ZrO_2$). For another example, the thin film includes silicon oxide ($SiO_2$), but embodiments of the present inventive concepts are not limited thereto.

The precursor supply 13 is located on one side of the showerhead 14. The precursor supply 13 provides the showerhead 14 with the precursor gas 15. The precursor gas 15 includes a zirconium compound. Additionally or alternatively, the precursor gas 15 may include silane, but embodiments of the present inventive concepts are not limited thereto.

The first power supply 16 is connected to the chuck 12. In addition, the first power supply 16 is connected to the showerhead 14, but embodiments of the present inventive concepts are not limited thereto. The first power supply 16 provides the chuck 12 or the showerhead 14 with the first RF power 18 and produces the plasma P from the precursor gas 15 and the ozone 34. The first RF power 18 ranges from about 1 kW to about 10 kW. The first RF power 18 has a pulse frequency of about 400 kHz to about 60 MHz.

The ozone supply 20 is connected between the process chamber 10 and the oxygen purifier 40. The ozone supply 20 is located on another side of the showerhead 14, opposite from the precursor supply 13. The ozone supply 20 provides the showerhead 14 with the ozone 34. The ozone supply 20 includes first electrodes 22. The first electrodes 22 use a second RF power 28 received from second power supply 26 and produces the ozone 34 from a source gas 32. The source gas 32 for the ozone 34 includes oxygen ($O_2$).

The second power supply 26 is connected to the first electrodes 22. The second power supply 26 provides the first electrodes 22 with the second RF power 28. The second RF power 28 is less than the first RF power 18. The second RF power 28 ranges from about 100 W to about 1 kW.

The oxygen supply 30 is connected to the oxygen purifier 40 and the ozone supply 20. The oxygen supply 30 provides the oxygen purifier 40 with the source gas 32. The oxygen supply 30 includes an oxygen storage tank. The source gas 32 includes oxygen, carbon dioxide, and an inactive or inert gas, referred to hereinafter as the inactive gas.

The oxygen purifier 40 is connected between the oxygen supply 30 and the ozone supply 20. The oxygen purifier 40 adsorbs the carbon dioxide ($CO_2$) in the source gas 32 and purifies the oxygen of the source gas 32. In addition, the oxygen purifier 40 adsorbs organic materials in the source gas 32. Furthermore, the oxygen purifier 40 includes an adsorption catalyst, such as platinum, but embodiments of the present inventive concepts are not limited thereto.

At least one of the impurity detectors 50 is disposed between the ozone supply 20 and the oxygen purifier 40. In addition, another impurity detector 50 is disposed between the oxygen supply 30 and the oxygen purifier 40. The impurity detectors 50 detect the inactive gas, such as $N_2$ or Ar, in the source gas 32. The inactive gas can cause a failure of thin-film deposition. When the impurity detectors 50 detect the inactive gas in the source gas 32, a controller generates an interlock control signal that reduces or minimizes failure of thin-film deposition performed in the process chamber 10. The oxygen supply 30 is replaced with a new oxygen supply. Therefore, the semiconductor fabrication apparatus 100 according to an embodiment of the present inventive concepts uses the impurity detectors 50 to increase a production yield of thin films.

In an embodiment, the impurity detectors 50 include a first impurity detector 52 and a second impurity detector 54.

The first impurity detector 52 is disposed between the oxygen supply 30 and the oxygen purifier 40. The first impurity detector 52 detects carbon dioxide. Alternatively, in an embodiment, the first impurity detector 52 detects the inactive gas, but embodiments of the present inventive concepts are not limited thereto.

The second impurity detector 54 is disposed between the ozone supply 20 and the oxygen purifier 40. The second impurity detector 54 detects the inactive gas after removal of the carbon dioxide.

Accordingly, the controller uses detection signals of the first and second impurity detectors and 54 to determine a removal amount of the carbon dioxide in the oxygen purifier 40.

Third power supplies 56 are connected to the first impurity detector 52 and the second impurity detector 54. The third power supplies 56 provide the first and second impurity detectors 52 and 54 with third RF powers 58 that induce a plasma reaction between the oxygen, the carbon dioxide, and the inactive gas of the source gas 32. The third RF power 58 is less than the second RF power 28. For example, the third RF power 58 ranges from about 10 W to about 100 W. The third RF power 58 has a frequency of from about 20 kHz to about 60 kHz and an alternating current (AC) of from about 1 kV to about 7 kV. The first impurity detector 52 and the second impurity detector 54 detect plasma light (see 61 of FIG. 2) of the carbon dioxide and the inactive gas.

Figure 2:
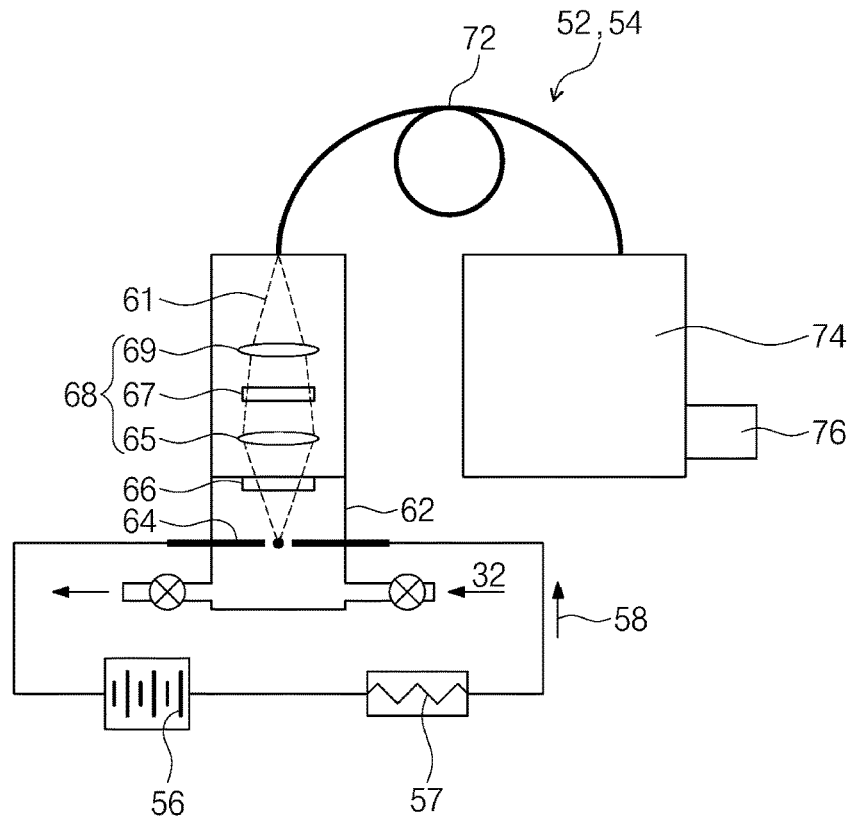
FIG. 2 is a cross-sectional view of an example of an impurity detector shown in FIG. 1.

FIG. 2 shows an example of the first impurity detector 52 and the second impurity detector 54 depicted in FIG. 1.

Referring to FIG. 2, in an embodiment, each of the first impurity detector 52 and the second impurity detector 54 includes a gas cell 62, second electrodes 64, an optical system 68, an optical fiber 72, a spectroscope 74, and an optical sensor 76.

The gas cell 62 stores the source gas 32. The gas cell 62 includes a view port 66. The plasma light 61 of the source gas 32 is externally exposed outside of the gas cell 62 through the view port 66.

The second electrode 64 provides the gas cell 62 with high degree of airtightness. The second electrodes 64 are connected to the third power supply 56. A resistor 57 is connected between the third power supply 56 and one of the second electrodes 64. The resistor 57 adjusts the third RF power 58. The second electrodes 64 use the third RF power 58 to generate the plasma light 61 of the source gas 32. In a plasma reaction, oxygen in the source gas 32 produces the plasma light 61 with various discontinuous emission bands with a wide bandwidth that ranges between ultraviolet and near-infrared. Nitrogen ($N_2$) and argon (Ar) in the source gas 32 generate the discontinuous emission bands. For example, nitrogen ($N_2$) generates plasma light 61 with a wavelength of about 358 nm, and argon (Ar) generates plasma light 61 with a wavelength of about 813 nm. When the source gas 32 includes carbon dioxide or an organic material, the source gas 32 generates plasma light 61 at specific plasma emission bands from molecular and constituent atoms of the carbon dioxide or the organic material. The first impurity detector 52 and the second impurity detector 54 detect the plasma light 61 and analyze a concentration of the impurities. When analyzing an extremely small amount of impurities, such as nitrogen ($N_2$), argon (Ar), carbon dioxide, and an organic material, present in the source gas 32, the controller uses the intensity of oxygen emission band signals to normalize the intensity of the plasma light 61 and increase the accuracy of the impurity analysis.

Figure 3:
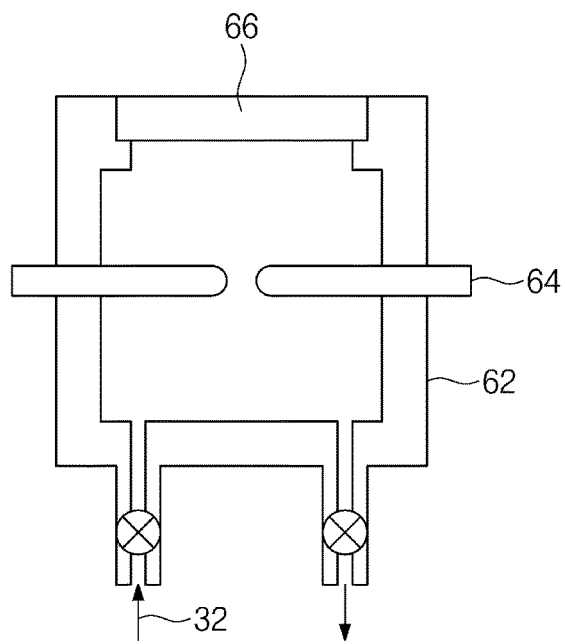
FIG. 3 is a cross-sectional view of an example of a gas cell shown in FIG. 2.

FIG. 3 shows an example of the gas cell 62 depicted in FIG. 2.

Referring to FIG. 3, in an embodiment, the gas cell 62 is a glow discharge gas cell. The second electrodes 64 include a cathode and an anode, and have a thickness of about 1 mm and a space therebetween. The second electrodes 64 include gold (Au), but embodiments of the present inventive concepts are not limited thereto. Each of the second electrodes 64 has a rounded shape at its tip. The gas cell 62 is provided with the source gas 32 in opposite directions. For example, the source gas 32 is introduced in an upper direction into the gas cell 62 and is discharged in a downward direction from the gas cell 62. In an embodiment of the present inventive concepts, because the analysis targets are nitrogen ($N_2$), argon (Ar), carbon dioxide ($CO_2$), etc., or main components of air, the gas cell 62 should be airtight to exclude interference of external air, and to accomplish the airtightness, special attention is needed when installing the electrodes, the view port 66, etc. A pressure range of the source gas 32 between about 30 Torr and about 80 Torr is an optimum condition in plasma emission analysis. It is possible not only to maintain a high density of plasma but also to maintain a low intensity baseline signal, which results in a maximum increase in analysis sensitivity.

Referring back to FIG. 2, in an embodiment, the optical system 68 is located on the view port 66. The optical system 68 provides the optical fiber 72 with the plasma light 61 of the source gas 32. The optical system 68 includes a first lens 65, a filter 67, and a second lens 69.

The first lens 65 is disposed between the view port 66 and the filter 67. The first, lens 65 projects the plasma light 61 of the source gas 32 onto the filter 67. The first lens 65 includes a convex lens, but embodiments of the present inventive concepts are not limited thereto.

The filter 67 is disposed between the first lens 65 and the second lens 69. The filter 67 selectively transmits or reflect a specific wavelength range chosen from a range between ultraviolet wavelength and near-infrared wavelength of the plasma light 61 that is a measurement target.

The second lens 69 is disposed between the filter 67 and the optical fiber 72. The second lens 69 focuses plasma light 61 on the optical fiber 72. The second lens 69 includes a convex lens. The second lens 69 may include an aspherical lens, but embodiments of the present inventive concepts are not limited thereto.

The optical fiber 72 is disposed between the second lens 69 and the spectroscope 74. The optical fiber 72 transmits the plasma light 61 of the carbon dioxide and the inactive gas to the spectroscope 74.

Figure 4:
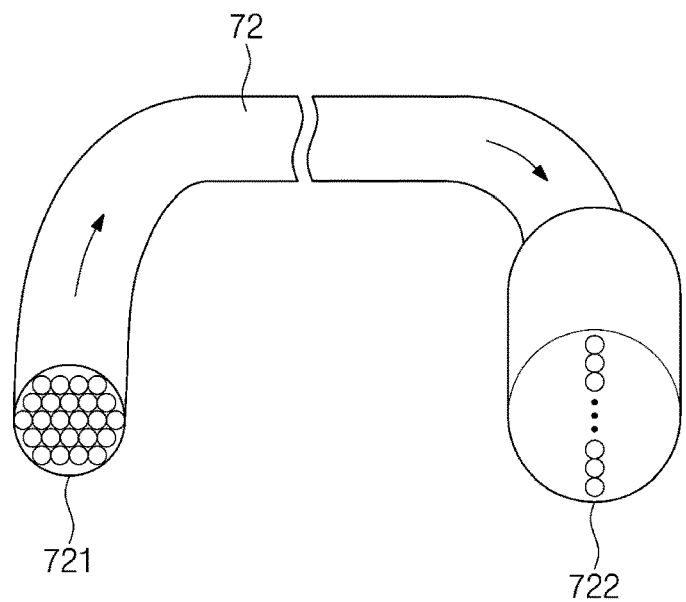
FIG. 4 is a perspective view of an example of an optical fiber shown in FIG. 2.

FIG. 4 shows an example of the optical fiber 72 depicted in FIG. 2.

Referring to FIG. 4, in an embodiment, the optical fiber 72 includes a plurality of optical fibers 72. The plurality of optical fibers 72 are coupled into a bundle. An input end 721 of the optical fibers 72 has a circular bundle shape, and maximally increases a light harvesting efficiency of the plasma light 61. An output end 722 of the optical fibers 72 has a linear bundle shape and is linearly arranged to maximally increase resolution of the spectroscope 74.

Referring again to FIG. 2, in an embodiment, the spectroscope 74 is connected between the optical fiber 72 and the optical sensor 76. The spectroscope 74 may include a prism or a diffraction grating.

The optical sensor 76 is disposed adjacent to the spectroscope 74. The optical sensor 76 detects the plasma light 61 of the carbon dioxide and the inactive gas. For example, in an embodiment, the optical sensor 76 includes a sensor array of complementary metal oxide semiconductor (CMOS) sensors or charge-coupled devices (CCD). Alternatively, in an embodiment, the optical sensor 76 may include a photodiode, but embodiments of the present inventive concepts are not limited thereto. In an embodiment, optical sensor 76 includes a pixel whose width is less than a width or thickness of the optical fiber 72. In addition, the optical sensor 76 includes a pixel array whose height or length is greater than a vertical height of the output end 722 of the optical fiber 72.

Figure 5:
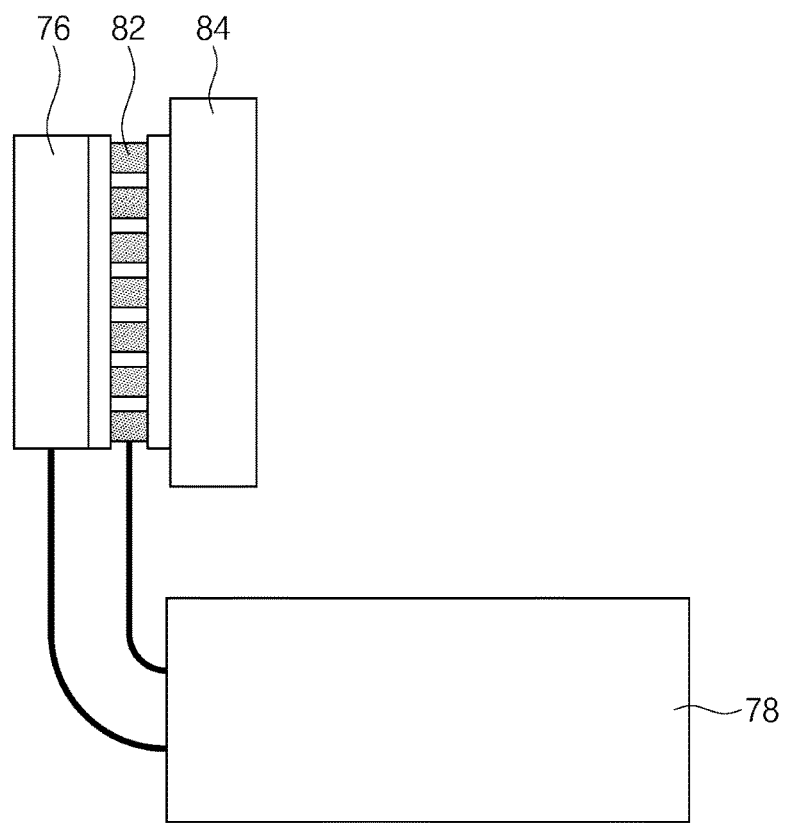
FIG. 5 is a cross-sectional view of an example of an optical sensor shown in FIG. 2.

FIG. 5 shows an example of the optical sensor 76 depicted in FIG. 2.

Referring to FIG. 5, in an embodiment, the optical sensor 76 is cooled by a cooler 82. The cooler 82 is in contact with one side or a bottom surface of the optical sensor 76. The cooler 82 includes a thermoelectric semiconductor device. The cooler 82 is provided on a heat sink 84. A temperature of the cooler 82 is controlled by a cooling controller 78. For example, the optical sensor 76 maintained at room temperature, e.g. about 20° C.

Accordingly, the semiconductor fabrication apparatus 100 according to an embodiment of the present inventive concepts uses the first impurity detector 52 and the second impurity detector 54 to detect the inactive gas in the source gas 32 during fabrication processes performed on the substrate W, thereby increasing a production yield of thin films.

The following will describe a semiconductor fabrication method according to embodiments of the present inventive concepts that uses the semiconductor fabrication apparatus 100.

Figure 6:
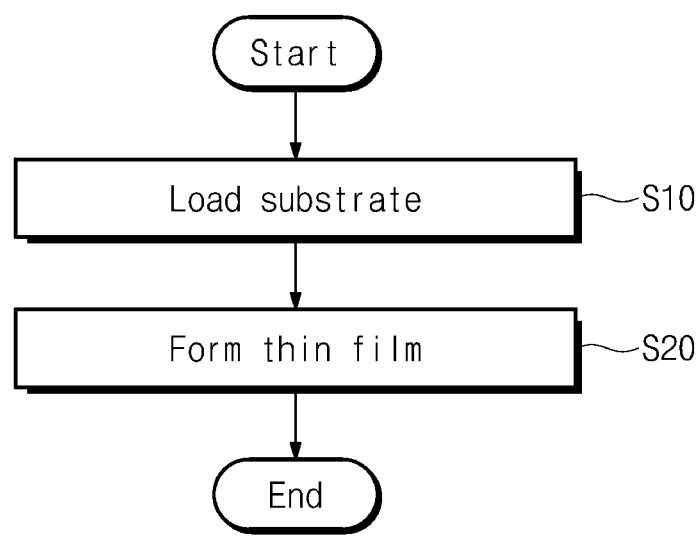
FIG. 6 is a flow chart of a semiconductor fabrication method according to some embodiments of the present inventive concepts.

FIG. 6 shows an example of a semiconductor fabrication method according to an embodiment of the present inventive concepts.

Referring to FIGS. 1 and 6, in an embodiment, the chuck 12 loads the substrate W (S10). A robot arm loads the substrate W onto the chuck 12 in the process chamber 10. The chuck 12 uses an electrostatic voltage to hold the substrate W. Alternatively, in an embodiment, the chuck 12 heats the substrate W, but embodiments of the present inventive concepts are not limited thereto.

Afterwards, the process chamber 110 uses the ozone 34 and the precursor gas 15 to form a thin film on the substrate W (S20). For example, the thin film may include zirconium oxide ($ZrO_2$) or silicon oxide ($SiO_2$).

FIG. 7 shows an example of the thin-film formation step S20 depicted in FIG. 6.

Referring to FIGS. 1 and 7, in an embodiment, the oxygen supply 30 supplies the source gas 32 (S210). The source gas 32 has a flow rate of about 1 SCCM to about 1,000 SCCM.

The first impurity detector 52 detects carbon dioxide in the source gas 32 (S220). The first impurity detector 52 uses the third RF power 58 to induce a plasma reaction in the source gas 32 and optically detects the carbon dioxide in the source gas 32. The optical sensor 76 of the first impurity detector 52 detects the plasma light 61 of the carbon dioxide. In addition, the first impurity detector 52 may detect the inactive gas in the source gas 32, but embodiments of the present inventive concepts are not limited thereto.

The oxygen purifier 40 removes the carbon dioxide from the source gas 32 to purify the oxygen of the source gas 32 (S230). The carbon dioxide is adsorbed by a catalyst in the oxygen purifier 40. In addition, the oxygen purifier 40 removes organic material from the source gas 32 to purity the source gas 32.

The second impurity detector 54 detects the inactive gas in the source gas 32 (S240). The second impurity detector 54 uses the third RF power 58 to induce a plasma reaction in the source gas 32 to optically detect the inactive gas in the source gas 32. The optical sensor 76 of the second impurity detector 54 detects the plasma light 61 of the inactive gas.

The controller uses a detection signal of the second impurity detector 54 to determine whether or not the inactive gas is present in the source gas 32 (S250).

When the inactive gas is absent in the source gas 32, the ozone supply 20 produces the ozone 34 from the source gas 32 and supplies the showerhead 14 with the ozone 34 (S260). The second power supply 26 provides the second RF power 28 to the first electrodes 22 of the ozone supply 20, and the source gas 32 is excited into a plasma state to generate the ozone 34. The ozone 34 is provided to the showerhead 14. The precursor supply 13 supplies the showerhead 14 with the precursor gas 15. The showerhead 14 provides the substrate W with the ozone 34 and the precursor gas 15.

The first power supply 16 supplies the chuck 12 with the first RIF power 18 to generate the plasma P from the ozone 34 and the precursor gas 15 (S270). The ozone 34 and the precursor gas 15 deposit a thin film on the substrate W. The plasma P increases a chemical reaction between the ozone 34 and the precursor gas 15 and increases homogeneity and/or uniformity of the thin film.

When the inactive gas is present in the source gas 32, the controller outputs an interlock control signal (S280). When the interlock control signal is output, a thin-film deposition process of the substrate W is terminated in the process chamber 10, with the result that a failure of thin-film deposition can be prevented or minimized.

Accordingly, a semiconductor fabrication method according to embodiments of the present inventive concepts detects an inactive gas in the source gas 32 and increases a production yield of thin films.

As described above, a semiconductor fabrication apparatus according to embodiments of the present inventive concepts uses impurity detectors to detect an inactive gas in a source gas that is used in a substrate fabrication process to increase a production yield of thin films.

The above descriptions are specific examples for practicing the present inventive concepts. Embodiments of the present inventive concepts include not only embodiments described above but also embodiments that can be easily or simply changed in design. In addition, embodiments of the present inventive concepts also include techniques that can be easily modified and implemented using embodiments described above.

What is claimed is:

1. A semiconductor fabrication apparatus, comprising:
   a process chamber that includes a chuck and a first power supply connected to the chuck;
   an ozone supply that provides the process chamber with ozone, wherein the ozone supply includes a first supply line connected to the process chamber, first electrodes disposed on both sides of the first supply line, and second power supply connected to the first electrodes;
   an oxygen supply that provides the ozone supply with a source gas for the ozone; and
   a plurality of impurity detectors disposed between the oxygen supply and the ozone supply, wherein the impurity detectors detect an inactive gas in the source gas, each of the plurality of impurity detectors includes a gas cell, second electrodes disposed in the gas cell, and third power supplies connected to the second electrodes, wherein the second electrodes are smaller than the first electrodes,
   wherein the first power supply provides a first radio frequency power into the chuck to generate a first plasma of a process gas,
   wherein the second power supply provides a second radio frequency power less than the first radio frequency power into the first electrodes to generate the ozone from the source gas,
   wherein each of the third power supplies provides a third radio frequency power less than the second radio frequency power into the second electrodes to generate a second plasma of the source gas,
   wherein the first radio frequency power is 1 KW to 10 KW,
   wherein the second radio frequency power is 100 W to 1 KW, and
   wherein the third radio frequency power is 10 W to 100 W.

2. The apparatus of claim 1, further comprising an oxygen purifier disposed between the oxygen supply and the ozone supply, wherein the oxygen purifier removes carbon dioxide in the source gas.

3. The apparatus of claim 2, wherein the impurity detectors include:
   a first impurity detector disposed between the oxygen supply and the oxygen purifier, wherein the first impurity detector detects the carbon dioxide; and
   a second impurity detector disposed between the oxygen purifier and the ozone supply, wherein the second impurity detector detects the inactive gas.

4. The apparatus of claim 1,
   wherein each of the third power supplies each include a resistor configured to adjust the third radio frequency power.

5. The apparatus of claim 1, wherein each of the impurity detectors further includes:
   an optical system disposed on a view port of the gas cell, wherein the optical system projects plasma light of the carbon dioxide or the inactive gas; and
   an optical sensor connected to the optical system, wherein the optical sensor detects the plasma light.

6. The apparatus of claim 5, wherein each of the impurity detectors further includes:
   an optical fiber disposed between the optical system and the optical sensor; and
   a spectroscope disposed between the optical fiber and the optical sensor.

7. The apparatus of claim 6, wherein the optical fiber includes a plurality of optical fibers,
   wherein the plurality of optical fibers include:
   an input end that has a circular bundle shape; and
   an output end that has a linear bundle shape.

8. The apparatus of claim 5, wherein each of the impurity detectors further includes a cooler in contact with the optical sensor, wherein the cooler cools the optical sensor.

9. The apparatus of claim 1, wherein the second electrodes include gold (Au).

* * * * *